United States Patent
Kaneko et al.

(10) Patent No.: US 11,849,641 B2
(45) Date of Patent: Dec. 19, 2023

(54) THERMOELECTRIC CONVERSION ELEMENT, THERMOELECTRIC CONVERSION MODULE, JOINING MATERIAL, AND METHOD FOR MANUFACTURING THERMOELECTRIC CONVERSION ELEMENT

(71) Applicant: Panasonic Intellectual Property Management Co., Ltd., Osaka (JP)

(72) Inventors: Yuriko Kaneko, Nara (JP); Tsutomu Kanno, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/698,910

(22) Filed: Mar. 18, 2022

(65) Prior Publication Data
US 2022/0209092 A1 Jun. 30, 2022

Related U.S. Application Data

(63) Continuation of application No. PCT/JP2020/042872, filed on Nov. 17, 2020.

(30) Foreign Application Priority Data

Dec. 25, 2019 (JP) ................................. 2019-233790

(51) Int. Cl.
*H10N 10/854* (2023.01)
*H10N 10/01* (2023.01)

(52) U.S. Cl.
CPC ........... *H10N 10/854* (2023.02); *H10N 10/01* (2023.02)

(58) Field of Classification Search
CPC ....... H10N 10/854; B23K 35/284; C22F 1/06; C22C 45/005; C22C 23/00
See application file for complete search history.

(56) References Cited

U.S. PATENT DOCUMENTS

2014/0216515 A1\* 8/2014 Ochi .................... H10N 10/817
136/205
2017/0069816 A1 3/2017 Horio et al.
(Continued)

FOREIGN PATENT DOCUMENTS

CN 110391328 A \* 10/2019 ............. H01L 35/32
JP 2014-049713 A 3/2014
(Continued)

OTHER PUBLICATIONS

JP-2016093831-A English machine translation (Year: 2016).\*
(Continued)

*Primary Examiner* — Andrew J Golden
(74) *Attorney, Agent, or Firm* — Rimon P.C.; Michael E. Fogarty

(57) ABSTRACT

A thermoelectric conversion element of the present disclosure includes a thermoelectric conversion layer, a first metal layer, a second metal layer, a first joining layer, and a second joining layer. At least one of the first joining layer and the second joining layer includes a second alloy. A content of Mg in the second alloy is 84 atm % or more and 89 atm % or less, a content of Cu in the second alloy is 11 atm % or more and 15 atm % or less, and a content of an alkaline earth metal in the second alloy is 0 atm % or more and 1 atm % or less.

14 Claims, 9 Drawing Sheets

(56) References Cited

U.S. PATENT DOCUMENTS

| | | | |
|---|---|---|---|
| 2017/0117453 A1* | 4/2017 | Tamaki | H10N 10/852 |
| 2018/0323360 A1 | 11/2018 | Kanno et al. | |
| 2020/0006616 A1 | 1/2020 | Uehara et al. | |

FOREIGN PATENT DOCUMENTS

| | | | |
|---|---|---|---|
| JP | 2016093831 A | * | 5/2016 |
| JP | 2017-050477 A | | 3/2017 |
| JP | 6127281 B1 | | 4/2017 |
| JP | 2018-190953 A | | 11/2018 |
| RU | 2279957 C1 | * | 7/2006 |
| WO | 2020/003554 A1 | | 1/2020 |

OTHER PUBLICATIONS

CN-110391328-A English machine translation (Year: 2019).*
RU-2279957-C1 English machine translation (Year: 2006).*
International Search Report dated Feb. 16, 2021 in International Patent Application No. PCT/JP2020/042872, with English translation.
D. Kraemer et al., "High Thermoelectric Conversion Efficiency of MgAgSb-based Material with Hot-Pressed Contacts," Energy & Environmental Science, vol. 8., pp. 1299-1308, 2015.

* cited by examiner

US 11,849,641 B2

THERMOELECTRIC CONVERSION ELEMENT, THERMOELECTRIC CONVERSION MODULE, JOINING MATERIAL, AND METHOD FOR MANUFACTURING THERMOELECTRIC CONVERSION ELEMENT

This application is a continuation of PCT/JP2020/042872 filed on Nov. 17, 2020, which claims foreign priority of Japanese Patent Application No. 2019-233790 filed on Dec. 25, 2019, the entire contents of both of which are incorporated herein by reference.

BACKGROUND OF THE INVENTION

1. Field of the Invention

The present disclosure relates to a thermoelectric conversion element, a thermoelectric conversion module, a joining material, and a method of manufacturing a thermoelectric conversion element.

2. Description of Related Art

Thermoelectric conversion elements are known. A thermoelectric conversion module is used in which a P-type thermoelectric conversion element including a P-type thermoelectric conversion material and an N-type thermoelectric conversion element including an N-type thermoelectric conversion material are electrically connected to each other. This thermoelectric conversion module enables electric power generation based on a temperature difference caused by an inflow of thermal energy. To facilitate electrical connection of a thermoelectric conversion element, a metal member is sometimes joined in advance to an edge face portion of a thermoelectric conversion material using a joining material or the like. It is easy to handle or assemble such a thermoelectric conversion element whose edge face portion is a metal member.

D. Kraemer et. al., "High thermoelectric conversion efficiency of MgAgSb-based material with hot-pressed contacts", Energy Environ. Sci., 2015, 8, 1299-1308 discloses a thermoelectric conversion element composed of a MgAgSb-based thermoelectric conversion material and a pair of Ag electrodes joined to the material.

JP 6127281 B2 discloses a MgSbBiTe-based thermoelectric conversion material.

SUMMARY OF THE INVENTION

An object of the present disclosure is to provide a thermoelectric conversion element having a low electric resistance value by using a thermoelectric conversion material containing Mg and at least one of Sb and Bi. In addition, an object of the present disclosure is to provide a thermoelectric conversion module having the thermoelectric conversion element, a joining material advantageous for manufacturing the thermoelectric conversion element, and a method of manufacturing the thermoelectric conversion element.

The present disclosure provides a thermoelectric conversion element including:
a thermoelectric conversion layer;
a first metal layer;
a second metal layer;
a first joining layer joining a first face of the thermoelectric conversion layer and the first metal layer; and
a second joining layer joining a second face of the thermoelectric conversion layer and the second metal layer, wherein
the thermoelectric conversion layer includes a thermoelectric conversion material, the thermoelectric conversion material containing Mg and at least one of Sb and Bi,
the first metal layer and the second metal layer each include a simple substance of metal or a first alloy,
at least one of the first joining layer and the second joining layer includes a second alloy,
a content of Mg in the second alloy is 84 atm % or more and 89 atm % or less,
a content of Cu in the second alloy is 11 atm % or more and 15 atm % or less, and
a content of an alkaline earth metal in the second alloy is 0 atm % or more and 1 atm % or less.

The present disclosure can provide a thermoelectric conversion element having a low electric resistance value by using a thermoelectric conversion material containing Mg and at least one of Sb and Bi. In addition, the present disclosure can provide a thermoelectric conversion module including the thermoelectric conversion element, a joining material advantageous for manufacturing the thermoelectric conversion element, and a method of manufacturing the thermoelectric conversion element.

Figure 1:
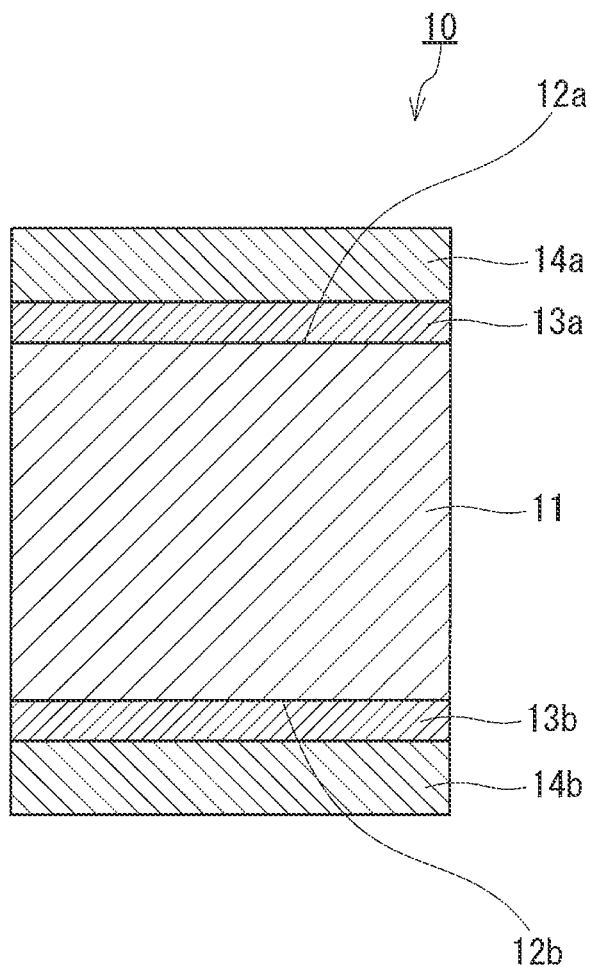
FIG. 1 is a schematic diagram showing an example of a thermoelectric conversion element of the present disclosure.

DETAILED DESCRIPTION (Findings Which Established the Foundation of the Present Disclosure)

A thermoelectric conversion material containing Mg and at least one of Sb and Bi can exhibit high thermoelectric conversion properties at up to approximately 400° C. In particular, a $Mg_3(Sb,Bi)_2$-based thermoelectric conversion material achieves a high thermoelectric conversion performance with a thermoelectric conversion performance index ZT=1.51 at 440° C. In the present specification, (Sb,Bi) in a composition formula indicates that at least one of Sb and Bi is contained. On the other hand, according to Journal of Solid State Chemistry, 2006, Vol. 179, pp. 2252-2257, at a temperature of 800K (527° C.) or more, a thermoelectric conversion material containing Mg and at least one of Sb and Bi degrades due to decomposition of the compound, so that the thermoelectric conversion efficiency might decrease. Also, an N-type thermoelectric conversion material containing Mg and at least one of Sb and Bi has properties which can change from the N-type to the P-type depending on the content of Mg in the thermoelectric conversion material. That is, in an N-type thermoelectric conversion material, a decrease in content of Mg in the thermoelectric conversion material makes the properties of the thermoelectric conversion material unstable. For example, the electric resistance value of the thermoelectric conversion element changes and the thermoelectric conversion efficiency might decrease. In contrast, in a P-type thermoelectric conversion material containing Mg and at least one of Sb and Bi, an influence of the content of Mg in the thermoelectric conversion material on the properties of the thermoelectric conversion material is small.

Studies by the present inventors found that, in producing a thermoelectric conversion element so as to have an edge face that is a metal member, particularly in producing an N-type thermoelectric conversion element, it is necessary to devise a method such that the thermoelectric properties do not deteriorate due to a reduction in content of Mg in the above thermoelectric conversion material caused by diffusion of Mg into the metal member.

The MgAgSb-based thermoelectric conversion element disclosed in D. Kraemer et. al., "High thermoelectric conversion efficiency of MgAgSb-based material with hot-pressed contacts", Energy Environ. Sci., 2015, 8, 1299-1308 has a structure in which metal members formed of the Ag electrodes are joined to edge faces of the element. However, D. Kraemer et. al., "High thermoelectric conversion efficiency of MgAgSb-based material with hot-pressed contacts", Energy Environ. Sci., 2015, 8, 1299-1308 made no report that Mg contained in the thermoelectric conversion element influences the joining properties with the electrodes. Further studies by the present inventors newly found that, by containing Mg richly in a joining material joining a thermoelectric conversion material containing Mg and at least one of Sb and Bi and a metal member to each other, it is possible to produce a thermoelectric conversion element with a maintained content of Mg in the thermoelectric conversion material. Accordingly, possible selection criteria for a joining material include: (i) having a heat resistance to up to 400° C.; (ii) melting at a temperature at which the element does not degrade, for example at a temperature not greatly exceeding 500° C.; and (iii) containing Mg richly. The selection criterion (iii) is particularly important as a selection criterion of a joining material joining an N-type thermoelectric conversion material containing Mg and at least one of Sb and Bi and a metal member. On the other hand, the selection criterion (iii) is not essential as a selection criterion of a joining material joining a P-type thermoelectric conversion material containing Mg and at least one of Sb and Bi and a metal member. However, by satisfying the selection criterion (iii), it is possible to provide a joining material applicable to both an N-type thermoelectric conversion material and a P-type thermoelectric conversion material each containing Mg and at least one of Sb and Bi. After repeating much trial and error, the present inventors finally found a joining material meeting this selection criteria. As a result, for example, a thermoelectric conversion element having a low electric resistance value was obtained in which the above thermoelectric conversion material and a metal member were favorably joined at a joining temperature of 500° C. or less.

Embodiments of the Present Disclosure

Hereinafter, embodiments of the present disclosure will be described with reference to the drawings.

(Thermoelectric Conversion Element)

FIG. 1 shows an example of a thermoelectric conversion element according to an embodiment of the present disclosure. A thermoelectric conversion element 10 shown in FIG. 1 includes a thermoelectric conversion layer 11, a first metal layer 14a, a second metal layer 14b, a first joining layer 13a, and a second joining layer 13b. The first joining layer 13a joins a first face 12a of the thermoelectric conversion layer 11 and the first metal layer 14a. The second joining layer 13b joins a second face 12b of the thermoelectric conversion layer 11 and the second metal layer 14b. The shape of the thermoelectric conversion element 10 shown in FIG. 1 is for example a rectangular parallelepiped. The shape of the thermoelectric conversion element 10 is not limited to any particular shape as long as the thermoelectric conversion element 10 has a three-dimensional shape which can form the above layer. For example, the shape may be a cube, other rectangular pillar, or a column.

[Thermoelectric Conversion Layer]

The thermoelectric conversion layer 11 for example forms a middle layer of a thermoelectric conversion element 10. The thickness of the thermoelectric conversion layer 11 is not limited to any particular value, and is for example 0.5 mm or more and 50 mm or less. The thermoelectric conversion layer 11 includes a thermoelectric conversion material containing Mg and at least one of Sb and Bi. The thermoelectric conversion material may be of an N-type, or may be of a P-type. The composition of the N-type thermoelectric conversion material according to the present embodiment is for example represented by Formula (I): $Mg_{3+m}A_aB_bD_{2-e}E_e$. The element A in Formula (I) is at least one selected from the group consisting of Ca, Sr, Ba, and Yb. The element B in Formula (I) is at least one selected from the group consisting of Mn and Zn. The element D in Formula (I) is at least one selected from the group consisting of Sb and Bi. The element E in Formula (I) is at least one selected from the group consisting of Se and Te. The value of m in Formula (I) is −0.39 or more and 0.42 or less. The value of a is 0 or more and 0.12 or less. The value of b is 0 or more and 0.48 or less. The value of e is 0.001 or more and 0.06 or less. The thermoelectric conversion material of the present embodiment can for example have any composition within the range of Formula (I). The thermoelectric conversion material of the present embodiment is preferably a $Mg_3(Sb,Bi)_2$-based thermoelectric conversion material. The $Mg_3(Sb,Bi)_2$-based thermoelectric conversion material includes $Mg_3(Sb,Bi)_2$ and a material in which part of elements of $Mg_3(Sb,Bi)_2$ is substituted by other element. In the case where the $Mg_3(Sb,Bi)_2$-based thermoelectric conversion material is a material in which part of elements of $Mg_3(Sb,Bi)_2$ is substituted by other element, the content of the other element is less than the content of Mg and is less than the sum of the content of Sb and the content of Bi on the amount-of-substance basis.

Figure 2:
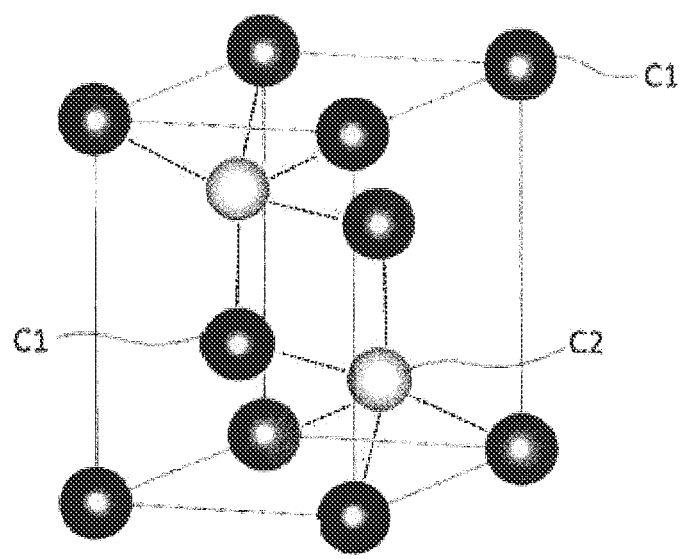
FIG. 2 is a schematic diagram of a $La_2O_3$-type crystal structure of the present disclosure.
Figure 3A:
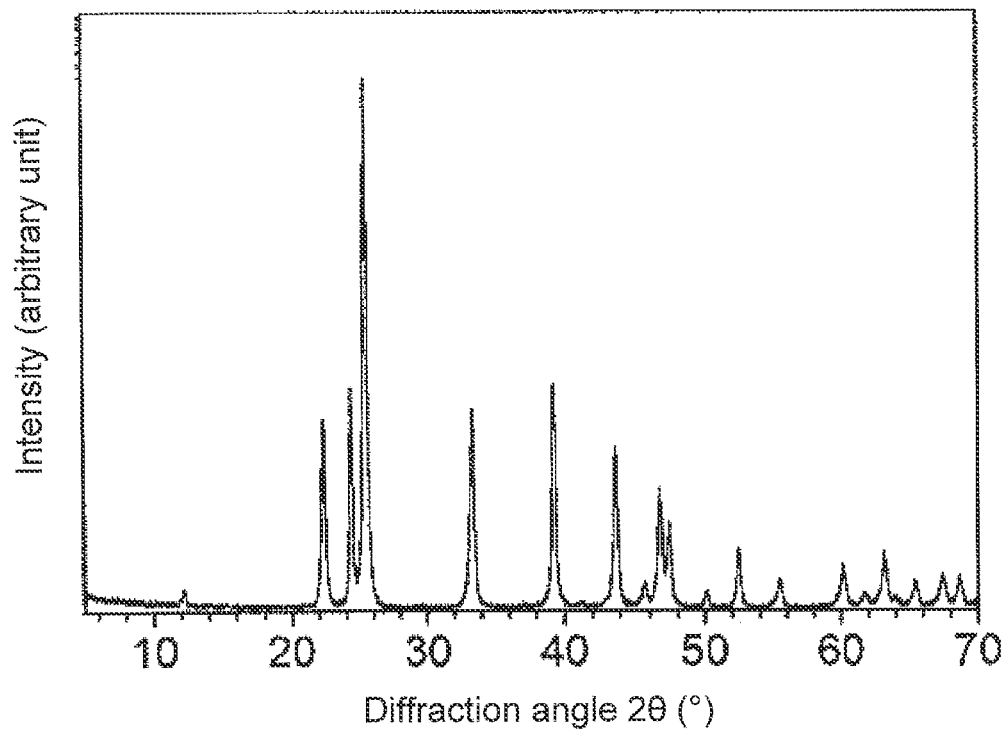
FIG. 3A is a graph showing an example of an X-ray diffraction pattern of a $La_2O_3$-type crystal structure.
Figure 3B:
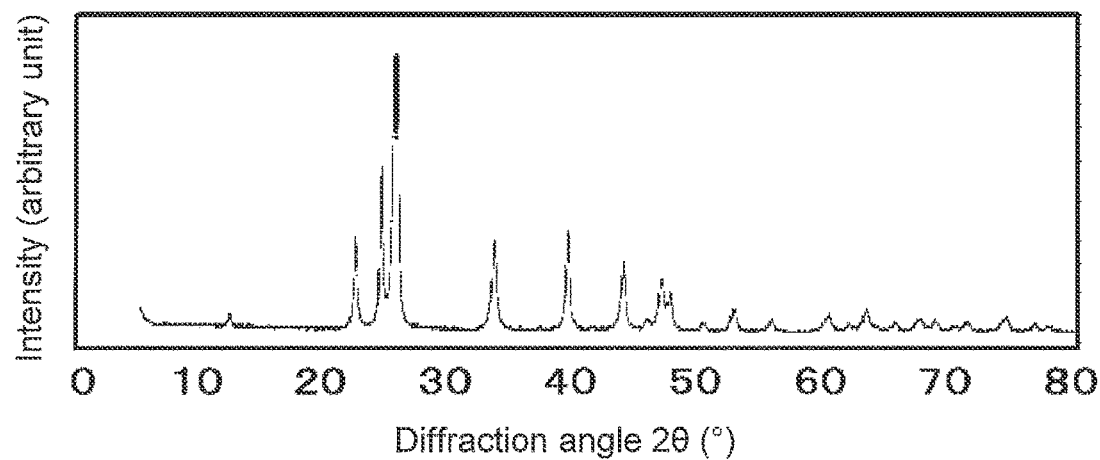
FIG. 3B is a graph showing results of X-ray diffraction analysis of a thermoelectric conversion material of the present disclosure.

The thermoelectric conversion material of the present embodiment for example has a $La_2O_3$-type crystal structure. FIG. 2 is a schematic diagram of a $La_2O_3$-type crystal structure. The thermoelectric conversion material of the present embodiment can be subjected to X-ray diffraction analysis. FIG. 3B shows an example of results of X-ray diffraction analysis of the thermoelectric conversion material of the present embodiment. FIG. 3A is a graph showing results of X-ray diffraction analysis of a $La_2O_3$-type crystal structure having a lattice constant of 0.460 nm in the a-axis direction, a lattice constant of 0.460 nm in the b-axis direction, and a lattice constant of 0.729 nm in the c-axis direction. The diffraction peak included in the results of X-ray diffraction analysis of the thermoelectric conversion material of the present embodiment coincides with the diffraction peak in FIG. 3A. Accordingly, it is understood from FIG. 3B that the thermoelectric conversion material according to the present embodiment for example has a $La_2O_3$-type crystal structure.

According to further analysis of the X-ray diffraction measurement results, in the $La_2O_3$-type crystal structure shown in FIG. 2, Mg is located at the C1 site, and at least one element of Sb and Bi is located at the C2 site. The C1 site and the C2 site form a bond as indicated by dotted lines in FIG. 2. The thermoelectric conversion material according to the present embodiment may be a single crystal, or may be a polycrystal. For the X-ray diffraction measurement, an X-ray diffractometer Aeris research edition manufactured by Spectris Co., Ltd. can be used, for example.

By changing the element E to Na or changing the value of e to 0 in the composition of Formula (I), the thermoelectric conversion material is more likely to have P-type properties. Such a change allows to obtain a P-type thermoelectric conversion material. For the composition of the thermoelectric conversion material according to the present embodiment, reference can be made to JP 6127281 B2 or US 2017/0117453 A1 corresponding thereto.

[Metal Layer]

The first metal layer 14a and the second metal layer 14b shown in FIG. 1 each for example form an edge face portion of the thermoelectric conversion element 10. The respective thicknesses of the first metal layer 14a and the second metal layer 14b are not limited to any particular values, and are for example 5 μm or more and 2 mm or less. The respective thicknesses of the layers may be the same, or may be different from each other. The first metal layer 14a and the second metal layer 14b may each include a simple substance of metal or a first alloy. The composition of the first metal layer 14a and the composition of the second metal layer 14b may be the same, or may be different from each other. The simple substance of metal or the first alloy, which is used for the first metal layer 14a and the second metal layer 14b, is not limited to any particular simple substance of metal or alloy. The simple substance of metal or the first alloy, which is used for the first metal layer 14a and the second metal layer 14b, is for example compatible with the first joining layer 13a or the second joining layer 13b, and has a melting point higher than a melting point of a material of the first joining layer 13a or the second joining layer 13b. At least one of the first metal layer 14a and the second metal layer 14b for example includes Cu or a Cu alloy, or Ag or an Ag alloy. Used for the first metal layer 14a and the second metal layer 14b according to the present embodiment is for example: Cu or a Cu alloy containing Cu as a main component; or Ag or an Ag alloy containing Ag as a main component, either of which is compatible with the first joining layer 13a or the second joining layer 13b. The Cu alloy is for example brass, red brass, gilding metal, phosphor bronze, Muntz metal, aluminum bronze, beryllium copper, nickel silver, or cupronickel. The Ag alloy is for example an Ag—Cu alloy, an Ag—Au alloy, or an Ag—Pd alloy.

The first joining layer 13a shown in FIG. 1 is positioned between the first face 12a of the thermoelectric conversion layer 11 and the first metal layer 14a, and the second joining layer 13b shown in FIG. 1 is positioned between the second face 12b of the thermoelectric conversion layer 11 and the second metal layer 14b. The respective thicknesses of the first joining layer 13a and the second joining layer 13b are not limited to any particular values, and are for example 10 μm or more and 3 mm or less. The respective thicknesses of the joining layers may be the same, or may be different from each other. At least one of the first joining layer 13a and the second joining layer 13b includes a second alloy. The content of Mg in the second alloy is 84 atm % or more and 89 atm % or less. The content of Cu in the second alloy is 11 atm % or more and 15 atm % or less. The content of an alkaline earth metal in the second alloy is 0 atm % or more and 1 atm % or less. An alloy having a content of Mg less than 84 atm % or exceeding 89 atm % has a melting point greatly exceeding 500° C., so that degradation of a thermoelectric conversion material or decrease in joining properties might occur. However, the melting point of the second alloy is less likely to greatly exceed 500° C., thereby preventing degradation of a thermoelectric conversion material. In addition, the joining properties between the thermoelectric conversion layer 11 and the first metal layer 14a or the second metal layer 14b are likely to be high. The content of Mg in the second alloy is 84.3 atm % or more, and at least one of the first joining layer 13a and the second joining layer 13b contains Mg richly. From the viewpoint of preventing deterioration of the properties of the thermoelectric conversion element 10 of the thermoelectric conversion layer 11 including an N-type thermoelectric conversion material, it is advantageous that Mg is less likely to move from the thermoelectric conversion layer 11 to the first joining layer 13a or the second joining layer 13b. Since at least one of the first joining layer 13a and the second joining layer 13b contains Mg richly, Mg is less likely to move from the thermoelectric conversion layer 11 to the first joining layer 13a or the second joining layer 13b. Accordingly, the electric resistance value of the thermoelectric conversion element 10 is low and is less likely to vary. As a result, the properties of the thermoelectric conversion element 10 are less likely to deteriorate.

The content of Mg, the content of Cu, and the content of the alkaline earth metal in the second alloy may be as follows. The content of Mg is 84.3 atm % or more and 88.5 atm % or less. The content of Cu is 10.5 atm % or more and 14.6 atm % or less. The content of the alkaline earth metal is 0.1 atm % or more and 1.1 atm % or less.

Since the second alloy contains the alkaline earth metal, the melting point of the second alloy is likely to be low. This allows to decrease the temperature for joining the thermoelectric conversion layer 11 according to the present embodiment and the first metal layer 14a or the second metal layer 14b, thereby suppressing thermal degradation of the thermoelectric conversion material forming the thermoelectric conversion layer 11 according to the present embodiment. The alkaline earth metal contained in the second alloy is not limited to any particular alkaline earth metal. The second alloy may contain one type of alkaline earth metal or two types of alkaline earth metals. The alkaline earth metal contained in the second alloy is for example Ca. As demonstrated in Example 1 described later, the content of Mg, the content of Cu, and the content of Ca in the second alloy are desirably as follows.

The content of Mg: 84.590 atm % or more and 84.600 atm % or less

The content of Cu: 14.355 atm % or more and 14.365 atm % or less

The content of Ca: 1.045 atm % or more and 1.055 atm % or less

The first joining layer 13a and the second joining layer 13b are each formed from a joining material. For example, out of the first joining layer 13a and the second joining layer 13b, at least one joining layer used on the higher temperature side is formed from a joining material including the above second alloy. For example, in the case where a metal layer closer to a heat source is the first metal layer 14a and a metal layer closer to the outside air is the second metal layer 14b, only the first joining layer 13a, which is in contact with the first metal layer 14a on the higher temperature side, is formed of the joining material including the second alloy. In this case, the second joining layer 13b may for example be formed of a joining material that is compatible with the thermoelectric conversion layer 11 and the second metal layer 14b and that can suppress variation in composition of the thermoelectric conversion layer 11. The second joining layer 13b may for example be formed of a joining material including a Mg-based alloy having a melting point lower than the melting point of the second alloy. Both the first joining layer 13a and the second joining layer 13b may be formed of the joining material including the second alloy.

(Thermoelectric Conversion Module)

Figure 4:
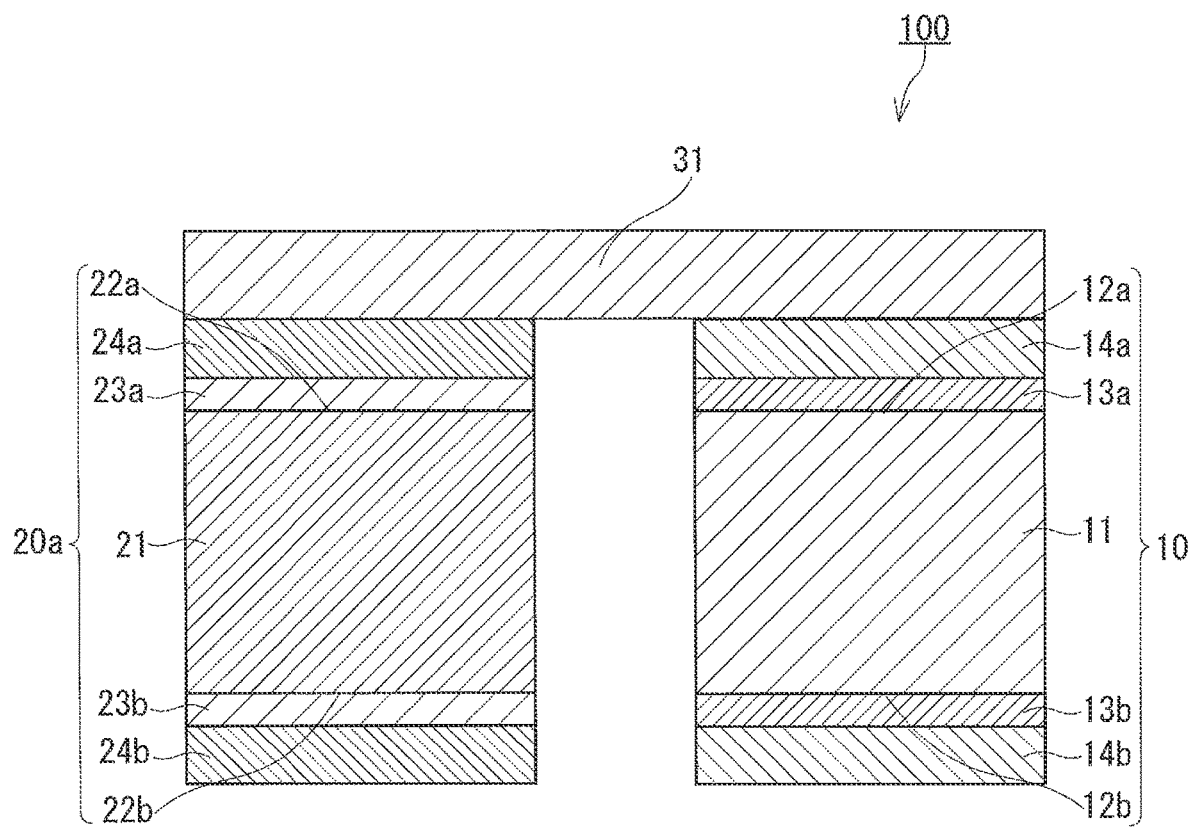
FIG. 4 is a schematic diagram showing an example of a thermoelectric conversion module of the present disclosure.

FIG. 4 shows an example of a thermoelectric conversion module of the present embodiment. A thermoelectric conversion module 100 shown in FIG. 4 includes a P-type thermoelectric conversion element 20a and the N-type thermoelectric conversion element 10 shown in FIG. 1. The P-type thermoelectric conversion element 20a and the N-type thermoelectric conversion element 10 are electrically connected in series. For example, the P-type thermoelectric conversion element 20a and the N-type thermoelectric conversion element 10 are electrically connected by an external electrode 31. The P-type thermoelectric conversion element 20a for example includes a thermoelectric conversion layer 21, a third metal layer 24a, a fourth metal layer 24b, a third joining layer 23a, and a fourth joining layer 23b. The third joining layer 23a joins a third face 22a of the thermoelectric conversion layer 21 and the third metal layer 24a. The fourth joining layer 23b joins a fourth face 22b of the thermoelectric conversion layer 21 and the fourth metal layer 24b. The thermoelectric conversion layer 21 includes a P-type thermoelectric conversion material. The P-type thermoelectric conversion material is desirably a $Mg_3(Sb,Bi)_2$-based thermoelectric conversion material. Examples of the P-type thermoelectric conversion material include materials represented by chemical formulas such as $Mg_{2.99}Na_{0.01}Sb_{1.0}Bi_{1.0}$, $Mg_{2.99}Na_{0.01}Sb_{1.5}Bi_{0.5}$, and $Mg_{3.07}Sb_{1.47}Bi_{0.53}$. This reduces the difference in thermal expansion between the P-type thermoelectric conversion material and the N-type thermoelectric conversion material, so that a thermoelectric conversion module with a reduced thermal stress can be produced. The composition of the third metal layer 24a and the fourth metal layer 24b may be the same as or different from the composition of the first metal layer 14a or the composition of the second metal layer 14b. Also, the composition of the joining material forming the third joining layer 23a and the fourth joining layer 23b may be the same as or different from the composition of the joining material forming the first joining layer 13a or the second joining layer 13b.

Figure 5:
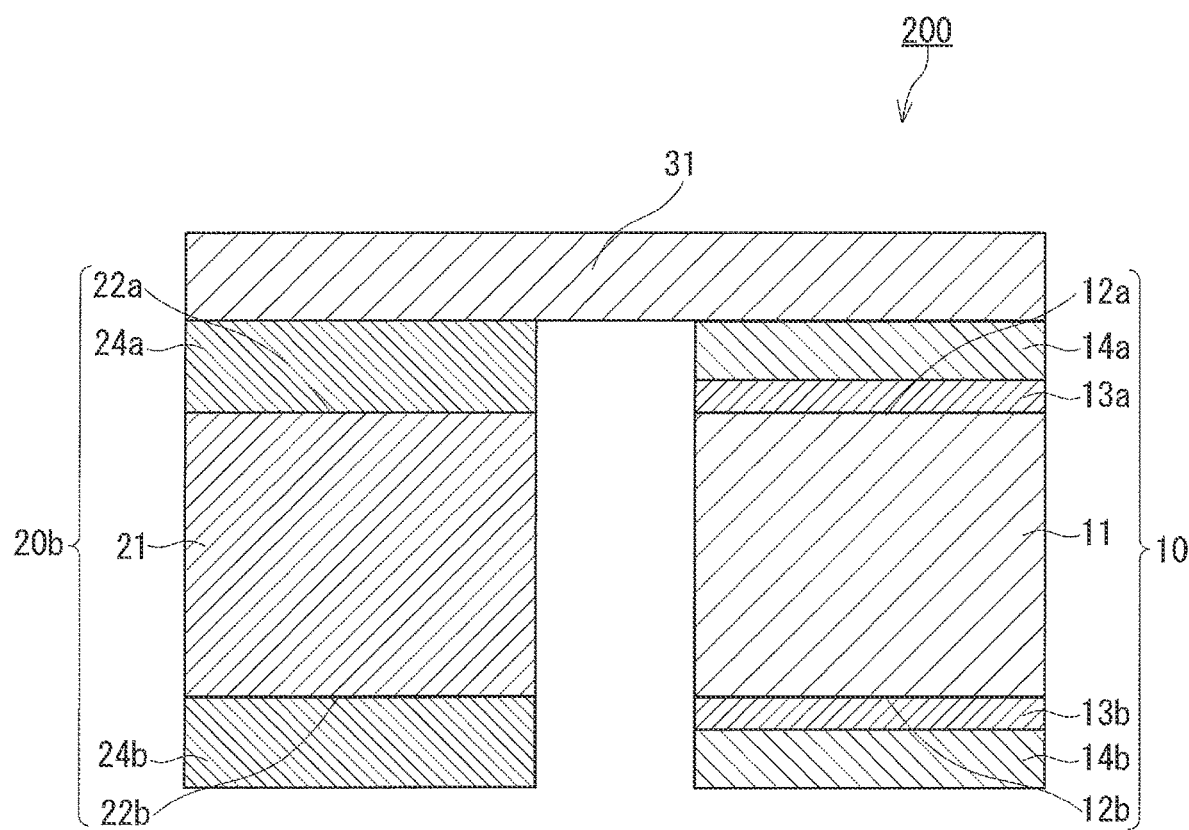
FIG. 5 is a schematic diagram showing a modification of the thermoelectric conversion module of the present disclosure.

FIG. 5 shows a modification of the thermoelectric conversion module of the present embodiment. A thermoelectric conversion module 200 shown in FIG. 5 includes a P-type thermoelectric conversion element 20b and the N-type thermoelectric conversion element 10 shown in FIG. 1. The P-type thermoelectric conversion element 20b and the N-type thermoelectric conversion element 10 are electrically connected in series. For example, the P-type thermoelectric conversion element 20b and the N-type thermoelectric conversion element 10 are electrically connected by the external electrode 31.

The P-type thermoelectric conversion element 20b includes the thermoelectric conversion layer 21, the third metal layer 24a, and the fourth metal layer 24b. In the P-type thermoelectric conversion element 20b shown in FIG. 5, the third face 22a of the thermoelectric conversion layer 21 and the third metal layer 24a are directly joined to each other. Similarly, the fourth face 22b of the thermoelectric conversion layer 21 and the fourth metal layer 24b are directly joined to each other. In the thermoelectric conversion module of the present embodiment, as in the thermoelectric conversion module 100 of FIG. 4, both the P-type thermoelectric conversion element 20a and the N-type thermoelectric conversion element 10 may each include a joining layer. Alternatively, in the thermoelectric conversion module of the present embodiment, as in the thermoelectric conversion module 200 of FIG. 5, only the N-type thermoelectric conversion element 10 may include a joining layer.

Figure 6:
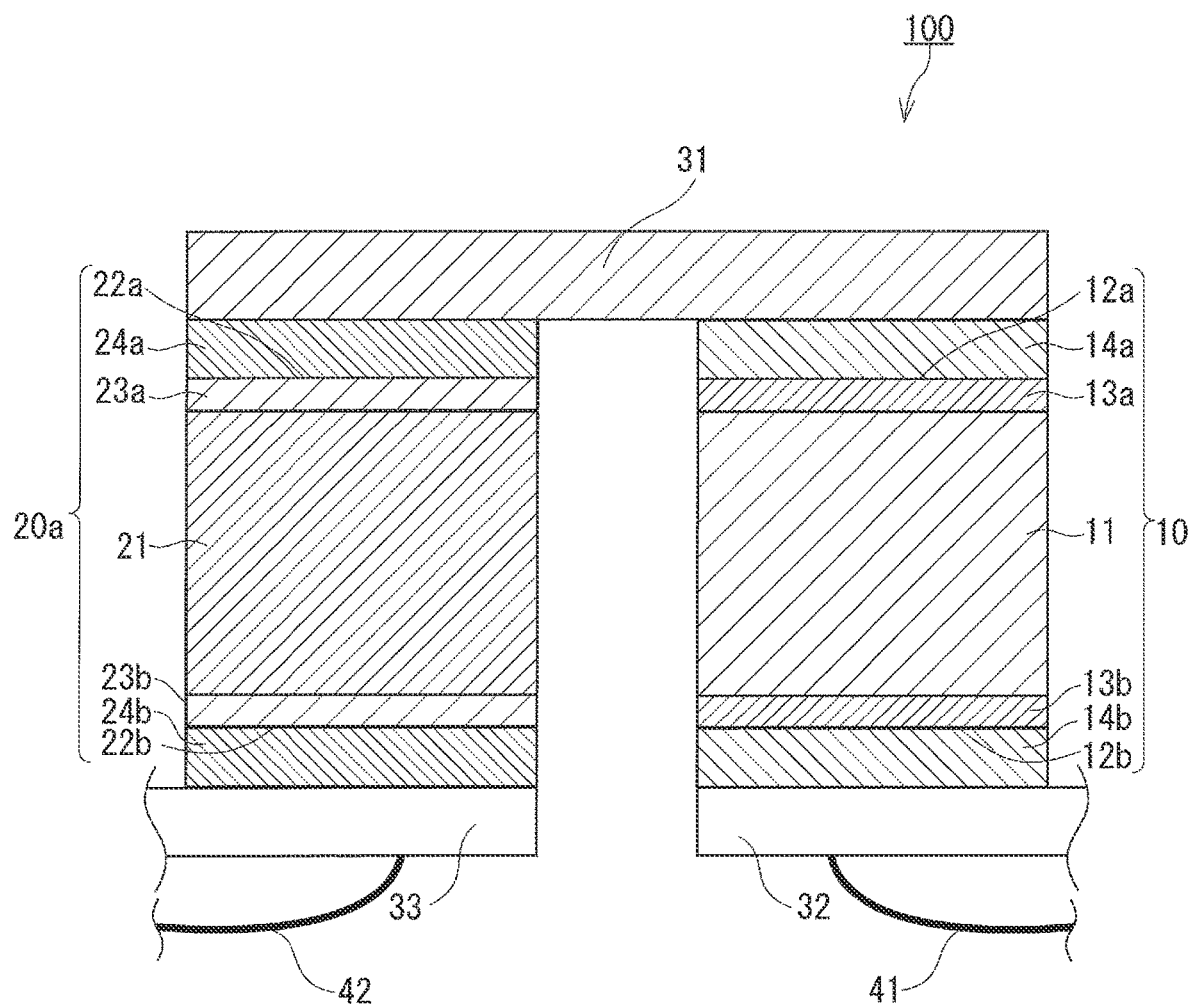
FIG. 6 is a schematic diagram showing an example of the thermoelectric conversion module of the present disclosure in use.

FIG. 6 shows an example of the thermoelectric conversion module 100 of the present embodiment in use. The P-type thermoelectric conversion element 20a is electrically connected to an external electrode 33 by the fourth metal layer 24b. Meanwhile, the N-type thermoelectric conversion element 10 is electrically connected to an external electrode 32 by the second metal layer 14b. Connected to the external electrode 33 is a second wiring 42, and connected to the external electrode 32 is a first wiring 41. The first wiring 41 and the second wiring 42 play a role of externally extracting an electric power generated in the P-type thermoelectric conversion element 20a and the N-type thermoelectric conversion element 10.

The thermoelectric conversion module may include the thermoelectric conversion element 10 as a P-type thermoelectric conversion element. In other words, in the thermoelectric conversion module, at least one of the N-type thermoelectric conversion element and the P-type thermoelectric conversion element may be the thermoelectric conversion element 10.

(Manufacturing Method)

[Method of Manufacturing Thermoelectric Conversion Material]

The following describes an example of a method of manufacturing the thermoelectric conversion material according to the present embodiment. However, the method of manufacturing the thermoelectric conversion material according to the present embodiment is not limited to the following example.

First, a raw material, which includes a Mg powder, at least one of a Sb powder and a Bi powder, and a powder of a doping material A, is put into a mill pot, and these powders are mechanically milled. The milling atmosphere is for example an inert gas atmosphere. This can suppress oxidation of the raw material. The inert gas is for example at least one of argon and helium. Through this process, a powder of a MgSbBiA precursor alloy is obtained, for example. Next, the MgSbBiA precursor alloy is subjected to sintering thus to obtain a MgSbBiA polycrystal. Employable for sintering is for example a spark plasma sintering method or a hot press method. The obtained polycrystal, with no treatment added, may be used as a thermoelectric conversion material. Alternatively, the obtained polycrystal may be subjected to a heat treatment. In this case, the polycrystal after the heat treatment can be used as a thermoelectric conversion material.

[Methods of Manufacturing Thermoelectric Conversion Element and Thermoelectric Conversion Module]

Figure 7:
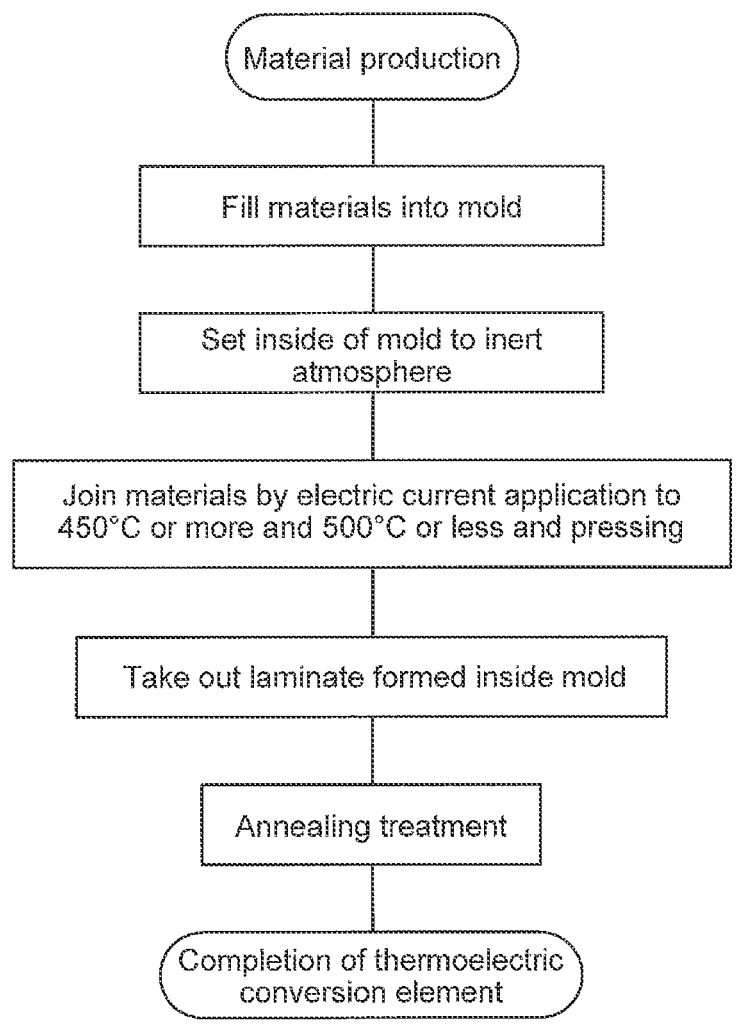
FIG. 7 is a process diagram of a method of manufacturing the thermoelectric conversion element of the present disclosure.

FIG. 7 is a process diagram showing an example of a method of manufacturing the thermoelectric conversion element according to the present embodiment. The following describes an example of the method of manufacturing the thermoelectric conversion element according to the present embodiment with reference to FIG. 8. However, the method of manufacturing the thermoelectric conversion element according to the present embodiment is not limited to the following example.

Mg, Cu, and an alkaline earth metal such as Ca are weighed to have predetermined compositions and are melted by a method such as high-frequency melting thus to obtain the second alloy of the present embodiment. The second alloy of the present embodiment is made into a powder by atomization, a grinding method using a ball mill, or the like thus to obtain a material of a joining layer.

A material 14c of the first metal layer, a material 13c of the first joining layer, the thermoelectric conversion layer 11 including a sintered thermoelectric conversion material, a material 13d of the second joining layer, and a material 14d of the second metal layer are filled in this order into a mold 50. Then, the inside of the mold 50 is set to an inert atmosphere. The inside of the mold 50 may be in an inert atmosphere when the materials are filled into the mold 50. Used as at least one of the material of the first joining layer and the material of the second joining layer is for example a material of a joining layer obtained by making the second alloy into a powder. Then, these materials are joined by heating at a predetermined temperature and pressurization thus to obtain a laminate. For example, the materials are pressed in a direction indicated by a black arrow 51 shown in FIG. 8, and an electric current corresponding to the temperature for joining the materials is applied in a direction indicated by a white arrow 52 shown in FIG. 8. In this manner, joining accompanied by sintering is performed to obtain a laminate. Then, the laminate is taken out from the mold 50 to obtain the thermoelectric conversion element 10. Employable for sintering is for example a spark plasma sintering method or a hot press method.

In this way, sintering of the thermoelectric conversion material is performed separately from joining of the thermoelectric conversion layer and the metal layer. This allows the sintering temperature of the thermoelectric conversion material to be higher than 500° C. Owing to the thermoelectric conversion material being a polycrystal, in the case where the sintering temperature is higher than 500° C., crystal grains coarsen by being held at a high temperature after generation of the polycrystal. That is, grain growth occurs. In some cases, a thermoelectric conversion material including crystal grains that have grown has improved thermoelectric properties.

For example, in the case where dissimilar metals are joined by diffusion joining under a hot press method, the joining properties of the dissimilar metals vary depending on the pressure and the temperature in the hot press, so that uniform joining of dissimilar metals over a large area is difficult. In contrast, according to the method of manufacturing the thermoelectric conversion element of the present embodiment, the melting point of the second alloy does not greatly exceed 500° C., and the use of the joining material including the second alloy easily achieves joining over a large area. Accordingly, according to the method of manufacturing the thermoelectric conversion element 10 using the joining material including the second alloy, a large number of thermoelectric conversion elements 10 can be manufactured at a time, and this method is advantageous from the viewpoint of mass production. For example, 36 thermoelectric conversion elements 10 can be manufactured at a time.

As shown in FIG. 7, a predetermined temperature for joining the materials is for example 450° C. or more and 500° C. or less. The use of the joining material including the second alloy allows to join the materials within such a temperature range.

[Evaluation of Compositions of Thermoelectric Conversion Element After Joining]

The compositions of the thermoelectric conversion layer, the joining layer, and the metal layer in the thermoelectric conversion element 10 after joining can be evaluated for example by an inductively coupled plasma (ICP) analysis method, an EDX analysis method used for evaluation of the sintered body of the thermoelectric conversion material, or the like.

Figure 9:
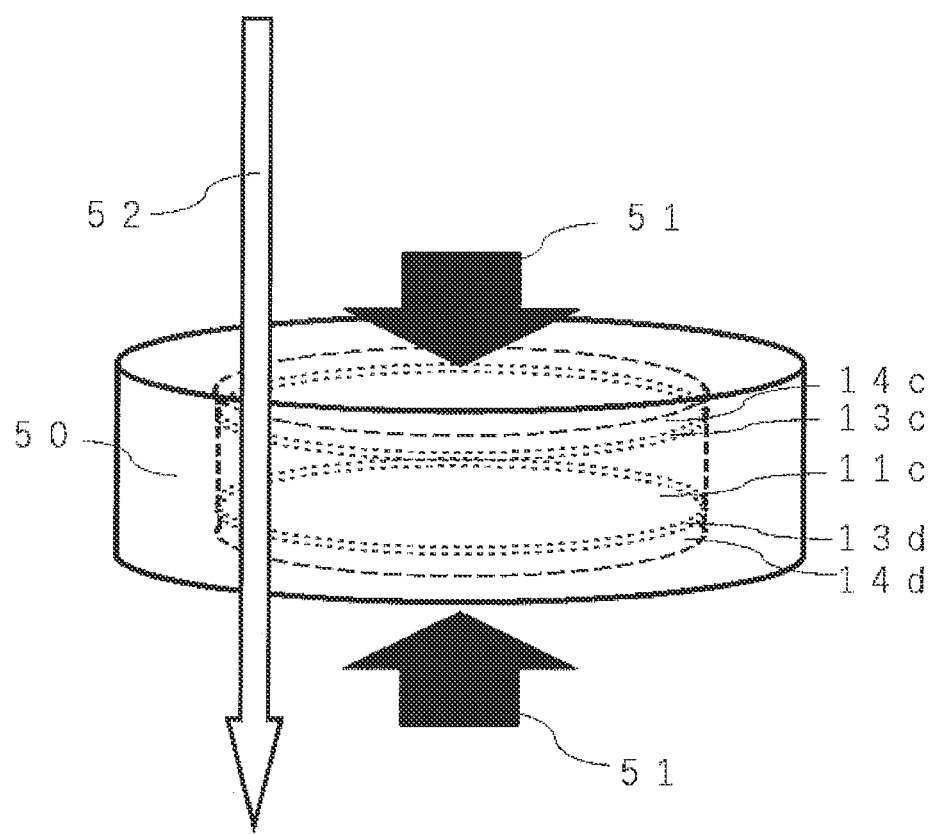
FIG. 9 is a schematic diagram showing a modification of the method of manufacturing the thermoelectric conversion element of the present disclosure.

The following describes a modification of the method of manufacturing the thermoelectric conversion element according to the present embodiment with reference to FIG. 9. In the manufacturing method shown in FIG. 9, the material 14c of the first metal layer, the material 13c of the first joining layer, a material 11c of the thermoelectric conversion layer, the material 13d of the second joining layer, and the material 14d of the second metal layer are filled in this order into the mold 50. Then, the inside of the mold 50 is set to an inert atmosphere. The inside of the mold 50 may be in an inert atmosphere when the materials are filled into the mold 50. Then, the materials are pressed in the direction indicated by the black arrow 51, and an electric current corresponding to the temperature for joining the materials is applied in the direction indicated by the white arrow 52. In this manner, joining accompanied by sintering is performed to obtain a laminate. Then, the laminate is taken out from the mold 50 to obtain the thermoelectric conversion element 10. Employable for sintering is for example a spark plasma sintering method or a hot press method.

Figure 8:
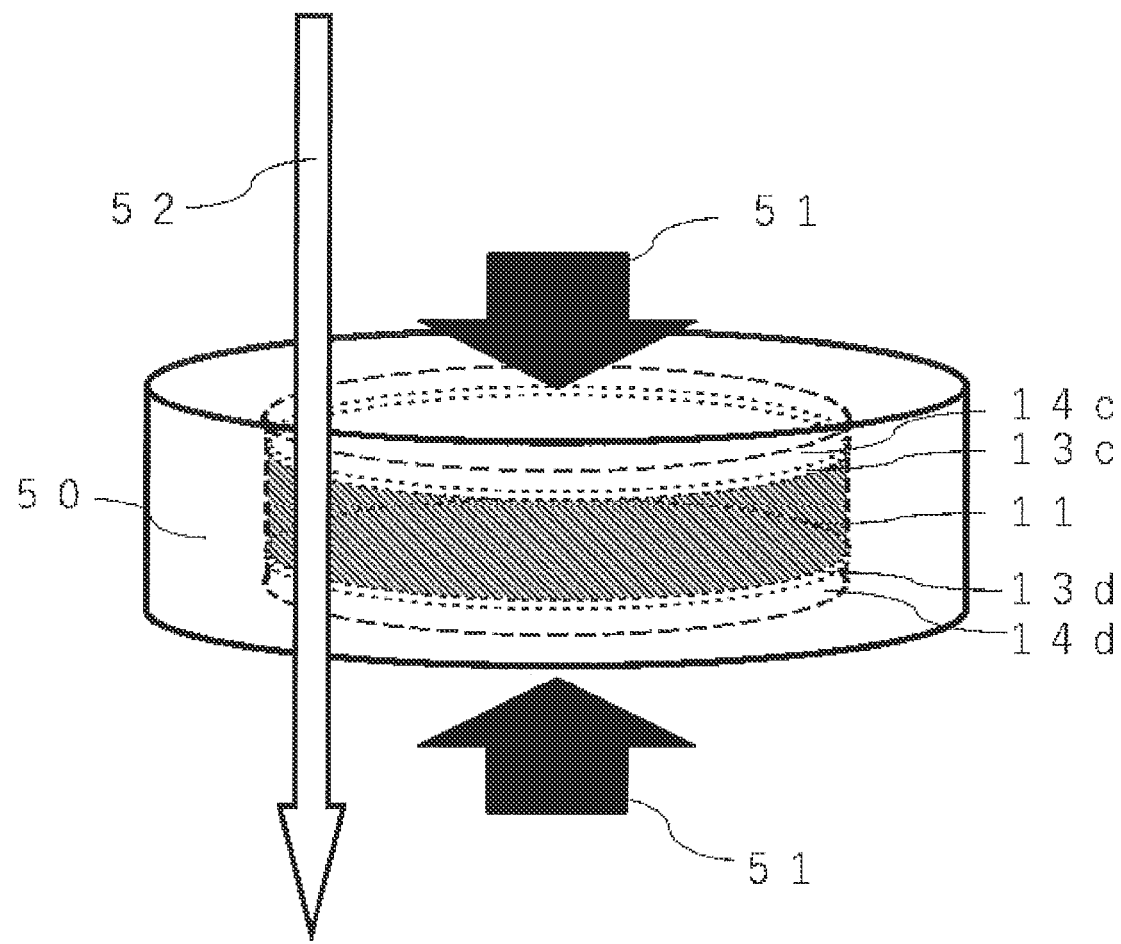
FIG. 8 is a schematic view showing an example of the method of manufacturing the thermoelectric conversion element of the present disclosure.

According to the present modification, sintering of the thermoelectric conversion material and joining of the thermoelectric conversion layer and the metal layer can be performed at a time, thereby simplifying the manufacturing process. In FIGS. 8 and 9, the materials are pressed in the upward direction and the downward direction indicated by the black arrows 51 to join the materials. The magnitude of the pressure in the upward direction and the downward direction is the same. Further, the magnitude of the pressure may be the same in the case as shown in FIG. 8 where sintering of the thermoelectric conversion material and joining of the thermoelectric conversion layer and the metal layer are performed separately and in the case shown in FIG. 9 where sintering of the thermoelectric conversion material and joining of the thermoelectric conversion layer and the metal layer are performed at a time. The magnitude of the pressure may differ between the cases.

The manufacturing method described with reference to FIGS. 8 and 9 may further include, for example, performing an annealing treatment on the laminate after taking out the laminate from the mold 50, as shown in FIG. 7. This removes a residual stress, and thus the thermoelectric conversion element 10 is likely to become homogenized. As a result, the thermoelectric conversion element 10 is likely to have a low electric resistance value.

With use of the P-type thermoelectric conversion element 20a or 20b and the N-type thermoelectric conversion element 10, assembly and manufacture of the thermoelectric conversion modules 100 and 200 can be performed by a known method.

The application of the thermoelectric conversion element of the present embodiment is not limited to any particular application. The thermoelectric conversion element of the present embodiment can for example be used for various applications including applications of conventional thermoelectric conversion elements.

EXAMPLES

Hereinafter, the thermoelectric conversion material of the present embodiment will be described in more detail with reference to examples. However, the thermoelectric conversion material of the present embodiment is not limited to aspects shown in the following examples.

Example 1

[Production of N-type Thermoelectric Conversion Layer]

In a glove box, 1.80 g of a Mg powder, 4.23 g of a Sb powder, 2.37 g of a Bi powder, and 0.0295 g of a Te powder were weighed as a raw material. The inside of the glove box has been adjusted to an argon atmosphere until a thermoelectric conversion material was obtained. Next, in the glove box, the weighed powders were put into a ball mill pot together with thirty stainless balls (diameter: 10 mm). The ball mill pot was made of stainless steel and had an internal volume of 80 milliliters (mL). Next, an opening of the ball mill pot was sealed in the glove box.

Next, the ball mill pot was taken out from the glove box and then placed in a ball mill apparatus. Selected as the ball mill apparatus was a planetary ball mill P-6 provided by Fritsch GmbH. The ball mill apparatus was operated to perform grinding processing for 4 hours. This grinding processing results in formation of a powder of a MgSbBiTe precursor alloy. The ratio of the number of atoms of Mg, Sb, Bi and Te in the powder of the MgSbBiTe precursor alloy was represented by a relation Mg:Sb:Bi:Te=3.20:1.50:0.49:0.01.

Next, the ball mill pot was transferred into the glove box. In the glove box, the powder was taken out from the ball mill pot. Approximately 5.3 g of the powder thus taken out was filled into a sintering space of a carbon die (sintering mold with a diameter of 20 mm), and was compacted with a carbon punch.

Next, the die was placed in a chamber of a spark plasma sintering apparatus. In Example 1, a spark plasma sintering apparatus SPS515S manufactured by SPS Syntex Inc. was used. The chamber has been adjusted to an argon atmosphere. Next, while a pressure of 50 MPa was applied to the powder filled into the die, an electric current was applied to the die with the sintering apparatus. After the temperature of the die reached 850° C. which was a sintering temperature by the application of the electric current, the temperature was maintained for 5 minutes. Then, the heating of the die was stopped by gradually reducing the electric current. After the temperature of the die decreased to room temperature, a sintered body was taken out from the die. A contact surface of the sintered body as a thermoelectric conversion material which has been in contact with the punch was polished, and then was washed with acetone. The sintered body had a thickness of approximately 2.7 mm.

The obtained sintered body of the thermoelectric conversion material was evaluated by energy dispersive X-ray analysis (hereinafter referred to as "EDX"). Used as an EDX apparatus was an energy dispersive X-ray spectrometer for SEM XFlash6|10 manufactured by Bruker Corporation. Used as an SEM in combination with the above spectrometer was a field emission SEM (FE-SEM) SU8220 manufactured by Hitachi High-Technologies Corporation.

[Production of Joining Material]

A mixture of a Mg powder, a Cu powder, and a Ca powder was used as a material of a joining layer of Example 1. In Example 1, as shown in Table 1, 5.464 g of a Mg powder, 2.424 g of a Cu powder, and 0.112 g of a Ca powder were weighed as a raw material of a joining material in the glove box. Table 1 also shows the amounts of the weighed Mg powder, Cu powder, and Ca powder in the mixture of the Mg powder, the Cu powder, and the Ca powder in terms of mass percent. Specifically, the mixture of the Mg powder, the Cu powder, and the Ca powder includes Mg of 68.30 mass %, Cu of 30.30 mass %, and Ca of 1.40 mass %. The particle diameter of each of the powders was 90 μm or less. In addition, at least one of a Mg powder and a Cu powder may be added to a commercially available Mg—Cu—Ca alloy powder for weighing.

TABLE 1

|  | Mg (g) | Cu (g) | Ca (g) | Mg (mass %) | Cu (mass %) | Ca (mass %) |
| --- | --- | --- | --- | --- | --- | --- |
| Example 1 | 5.464 | 2.424 | 0.112 | 68.30 | 30.30 | 1.40 |
| Example 2 | 4.661 | 2.155 | 0.096 | 67.43 | 31.18 | 1.39 |
| Example 3 | 5.979 | 1.932 | 0.089 | 74.74 | 24.15 | 1.11 |

Table 1 shows the amounts of the Mg powder, the Cu powder, and the Ca powder in the mixture thereof used for production of the joining material in Examples 1 to 3 in terms of mass and mass percent. The inside of the glove box has been adjusted to an argon atmosphere until the material of the joining layer was obtained. Next, the mixture of the weighed powders was melted and heated at 480° C. for 1 hour in the glove box. Then, a resulting alloy was ground in a mortar to form a powder. The joining material according to Example 1 was thus obtained.

[Joining of Materials]

The thermoelectric conversion material and a Cu plate washed with acetone were transferred into the glove box. The Cu plate had a diameter of 20 mm and a thickness of 0.2 mm. In the glove box, one Cu plate, 0.25 g of the joining material according to Example 1, the thermoelectric conversion material, 0.25 g of the joining material according to Example 1, and one Cu plate are filled in this order into a sintering space of a mold which is a carbon die, and are compacted with a punch.

Next, the die was placed in a chamber of a spark plasma sintering apparatus. The chamber has been adjusted to an argon atmosphere. Next, while a pressure of 50 MPa was applied to the filling in the die, an electric current was applied to the die with the sintering apparatus. After the temperature of the die reached 450° C. which was the maximum joining temperature by the application of the electric current, the temperature was maintained for 1 minute. Then, the heating of the die was stopped by gradually reducing the electric current. After the temperature of the die decreased to room temperature, a thermoelectric conversion element substrate was taken out from the die. Table 2 shows the maximum joining temperature.

TABLE 2

|  | Mg (atm %) | Cu (atm %) | Ca (atm %) | Maximum joining temperature (° C.) |
|---|---|---|---|---|
| Example 1 | 84.59 | 14.36 | 1.05 | 450 |
| Example 2 | 84.08 | 14.87 | 1.05 | 500 |
| Example 3 | 88.29 | 10.91 | 0.80 | 500 |

Table 2 shows the contents of Mg, Cu, and Ca in the joining materials according to Examples 1 to 3 in terms of atomic weight percent. In addition, Table 2 shows the maximum values of the temperature for joining the thermoelectric conversion layer and the metal layer in Examples 1 to 3. The atomic weight percentages can be calculated from Equations 1 to 3 below.

(atomic weight percentage of Mg)=A/(A+B+C)×100    Equation 1

(atomic weight percentage of Cu)=B/(A+B+C)×100    Equation 2

(atomic weight percentage of Ca)=C/(A+B+C)×100    Equation 3

Figure 10:
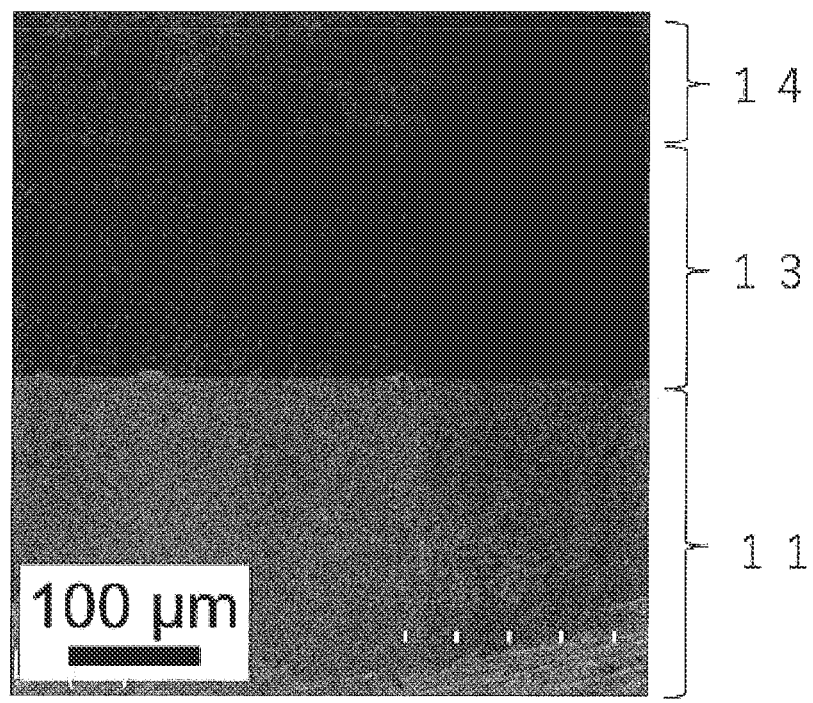
FIG. 10 shows a result of observation by a scanning electron microscope (hereinafter referred to as "SEM") on a cross section of a thermoelectric conversion element produced in Example 1.

A, B and C described in Equations 1 to 3 above are as follows.
A=(mass percentage of Mg)/(atomic weight of Mg)
B=(mass percentage of Cu)/(atomic weight of Cu)
C=(mass percentage of Ca)/(atomic mass of Ca)
[Annealing Treatment]
The obtained thermoelectric conversion element substrate was annealed in a furnace adjusted to an argon atmosphere. The temperature in the furnace was maintained at 470° C. for 30 minutes and then the furnace was slowly cooled.
[Production of N-type Thermoelectric Conversion Element]
A thermoelectric conversion element substrate having a diameter of 20 mm was cut into 3.5-mm square elements with a diamond cutter, and the elements were washed with acetone. In this manner, twelve N-type thermoelectric conversion elements according to Example 1 were produced.
(Observation of Cross Section of Thermoelectric Conversion Element)
FIG. 10 shows a result of SEM observation on a cross section of the thermoelectric conversion element according to Example 1. The thermoelectric conversion element according to Example 1 had a thickness of approximately 3.2 mm. In the thermoelectric conversion element according to Example 1, the thermoelectric conversion layer 11 containing Mg, Sb, and Bi had a thickness of approximately 2.7 mm, the metal layer 14 formed of a Cu plate had a thickness of approximately 100 μm, and the joining layer 13 containing Mg, Cu, and Ca had a thickness of approximately 150 μm.

Example 2

A thermoelectric conversion element according to Example 2 was produced in the same manner as in Example 1 except that a raw material of a joining material was weighed at the ratio shown in Table 1, and that the maximum joining temperature was changed to 500° C.

Example 3

A thermoelectric conversion element according to Example 3 was produced in the same manner as in Example 1 except that a raw material of a joining material was weighed at the ratio shown in Table 1, and that the maximum joining temperature was changed to 500° C.

Example 4

A thermoelectric conversion element according to Example 4 was produced in the same manner as in Example 1 except that an Ag plate was used instead of a Cu plate.

Comparative Example 1

A thermoelectric conversion element according to Comparative Example 1 was produced in the same manner as in Example 4 except that an Ag plate and a thermoelectric conversion layer were directly joined to each other without using a joining material.

Example 5

[Production of P-type Thermoelectric Conversion Layer]
In a glove box, 11 g of a Mg powder, 18.4302 g of a Sb powder, 31.6323 g of a Bi powder, and 0.0348 g of a Na powder were weighed as a raw material. The inside of the glove box has been adjusted to an argon atmosphere until a thermoelectric conversion material was obtained. Next, in the glove box, the weighed powders were put into a ball mill pot together with one hundred and eighty seven stainless balls (diameter: 10 mm). The ball mill pot was made of stainless steel and had an internal volume of 500 milliliters (mL). Next, an opening of the ball mill pot was sealed in the glove box.

Next, the ball mill pot was taken out from the glove box and then placed in a ball mill apparatus. Selected as the ball mill apparatus was a planetary ball mill P-5 provided by Fritsch GmbH. The ball mill apparatus was operated to perform grinding processing for 5.7 hours. This grinding processing results in formation of a powder of a MgSbBiNa precursor alloy. The ratio of the number of atoms of Mg, Sb, Bi, and Na in the powder of the MgSbBiNa precursor alloy was represented by a relation Mg:Sb:Bi:Na=2.99:1.0:1.0:0.01.

Next, the ball mill pot was transferred into the glove box. In the glove box, the powder was taken out from the ball mill pot. Approximately 1 g of the powder thus taken out was filled into a sintering space of a carbon die (sintering mold with a diameter of 10 mm), and was compacted with a carbon punch.

Next, the die was placed in a chamber of a spark plasma sintering apparatus. A sintered body of a P-type thermoelectric conversion material according to Example 5 was obtained in the same manner as in Example 1 except that the maximum joining temperature was 680° C.
[Production of Joining Material]
In the same manner as in Example 1, a raw material of a joining material was weighed at the ratio shown in Table 3.

TABLE 3

|  | Mg (g) | Cu (g) | Ca (g) | Mg (mass %) | Cu (mass %) | Ca (mass %) |
|---|---|---|---|---|---|---|
| Example 5 | 5.464 | 2.424 | 0.112 | 68.30 | 30.30 | 1.40 |
| Example 6 | 5.979 | 1.932 | 0.089 | 74.74 | 24.15 | 1.11 |
| Comparative Example 2 | 3.800 | 4.128 | 0.078 | 43.65 | 47.42 | 8.94 |

Table 3 shows the amounts of the Mg powder, the Cu powder, and the Ca powder in the mixture thereof used for production of the joining material in Examples 5 and 6 and Comparative Example 2 in terms of mass and mass percent. A joining material according to Example 5 was obtained in the same manner as in Example 1.

[Joining of Materials]

A thermoelectric conversion element substrate according to Example 5 was obtained in the same manner as in Example 1 except that the P-type thermoelectric conversion material according to Example 5 was used as a thermoelectric conversion material.

TABLE 4

|  | Mg (atm %) | Cu (atm %) | Ca (atm %) | Maximum joining temperature (° C.) |
|---|---|---|---|---|
| Example 5 | 84.59 | 14.36 | 1.05 | 450 |
| Example 6 | 88.29 | 10.91 | 0.80 | 450 |
| Comparative Example 2 | 64.95 | 26.99 | 8.07 | 450 |

Table 4 shows the contents of Mg, Cu, and Ca in the joining materials according to Examples 5 and 6 and Comparative Example 2 in terms of atomic weight percent. In addition, Table 4 shows the maximum values of the temperature for joining the thermoelectric conversion layer and the metal layer in Examples 5 and 6 and Comparative Example 2. The atomic weight percentages can be calculated from Equations 1 to 3 above.

[Production of P-type Thermoelectric Conversion Element]

A thermoelectric conversion element substrate having a diameter of 10 mm was cut into 3.4-mm square elements with a diamond cutter, and the elements were washed with acetone. In this manner, four P-type thermoelectric conversion elements according to Example 5 were produced.

Example 6

A raw material of a joining material was weighed at the ratio shown in Table 3, and a thermoelectric conversion element according to Example 6 was produced in the same manner as in Example 5.

Comparative Example 2

A raw material of a joining material was weighed at the ratio shown in Table 3, and a thermoelectric conversion element according to Comparative Example 2 was produced in the same manner as in Example 5.

Evaluation of Electric Resistance Value R, Electric Resistivity ρ, and Yield in N-type Thermoelectric Conversion Element)

With respect to the N-type thermoelectric conversion elements according to Examples 1 to 4, an electric resistance value R was measured by the four-terminal method. Results thereof are shown in Table 5.

TABLE 5

|  | Average value of element electric resistance value R (mΩ) | Average value of element electric resistivity ρ (μΩ · m) | Metal layer | Yield (%) |
|---|---|---|---|---|
| Example 1 | 8.1 | 31.0 | Cu | 100.0 |
| Example 2 | 33.6 | 128.6 | Cu | 16.7 |
| Example 3 | 13.1 | 50.1 | Cu | 41.7 |
| Example 4 | 33.5 | 128.2 | Ag | 75.0 |

Table 5 shows an average value of the electric resistance value R and an average value of an electric resistivity ρ of thermoelectric conversion elements having an electric resistance value R of 50 mΩ or less among the thermoelectric conversion elements according to each of Examples 1 to 4. In addition, Table 5 shows the yield in production of the N-type thermoelectric conversion elements according to Examples 1 to 4.

The electric resistivity ρ of the element was calculated from Equation 4 below.

$$\rho = R \times A / L \quad \text{Equation 4}$$

In Equation 4 above,

ρ represents the electric resistivity of the thermoelectric conversion element,

R represents the electric resistance value of the thermoelectric conversion element, A represents an element area (3.5 mm×3.5 mm) when the thermoelectric conversion element is viewed in plan, and L represents the thickness (3.2 mm) of a layer of the thermoelectric conversion element.

The yield of the elements was calculated Equation 5 below.

(Yield of elements)={(the number of elements having an electric resistance value R of 50 mΩ or less)/(the number of elements produced from a thermoelectric conversion element substrate)}× 100   Equation 5

In Examples 1 to 4, the number of elements produced from the thermoelectric conversion element substrate was twelve. In Example 1, as shown in Table 5, the average value of the electric resistance value R of the elements was 8.1 mΩ, the average value of the electric resistivity ρ of the elements was 31.0 μΩ·m, and the yield was 100.0%.

In Example 2, as shown in Table 5, the average value of the electric resistance value R of the elements was 33.6 mΩ, the average value of the electric resistivity ρ of the elements was 128.6 μΩ·m, and the yield was 16.7%.

In Example 3, as shown in Table 5, the average value of the electric resistance value R of the elements was 13.1 mΩ, the average value of the electric resistivity ρ of the elements was 50.1 μΩ·m, and the yield was 41.7%.

In Example 4, as shown in Table 5, the average value of the electric resistance value R of the elements was 33.5 mΩ, the average value of the electric resistivity ρ of the elements was 128.2 μΩ·m, and the yield was 75%.

In all of Examples 1 to 4 shown in Table 5, N-type thermoelectric conversion elements having an electric resistance value R of 50 mΩ or less were obtained. In particular, in Example 1, a yield of 100.0% was exhibited and thermoelectric conversion elements stably having an electric resistance value R of 50 mΩ or less were obtained. In addition, Example 1 exhibited the minimum average value of the electric resistance value R of the elements and the minimum average value of the electric resistivity ρ of the elements among Examples 1 to 4.

(Evaluation of Stability of Element Resistance)

The thermoelectric conversion elements according to Example 4 having an electric resistance value R of 12 mΩ and the thermoelectric conversion elements according to Comparative Example 1 having an electric resistance value R of 262 mΩ were heated in an environment of 400° C. for 12 hours. The electric resistance value R of the thermoelectric conversion elements according to Comparative Example 1 was measured by the four-terminal method. Then, the electric resistance value R of the thermoelectric conversion elements was measured again by the four-terminal method. The electric resistance value R of the thermoelectric conversion elements after heating was divided by the electric resistance value R of the thermoelectric conversion elements before heating to determine the rate of resistance change. Results thereof are shown in Table 6.

As shown in Table 6, in the thermoelectric conversion elements according to Example 4, the rate of resistance change of the electric resistance value R of the elements was low, which suggested that the resistance of the elements is less likely to change at high temperatures. In contrast, in the thermoelectric conversion elements according to Comparative Example 1, the rate of resistance change of the electric resistance value R of the elements was high, which suggested that the resistance of the elements is likely to change at high temperatures.

TABLE 6

| | Element electric resistance value R before heating (mΩ) | Element electric resistance value R after heating (mΩ) | Rate of resistance change [%] |
|---|---|---|---|
| Example 4 | 12 | 9 | 75 |
| Comparative Example 1 | 262 | 1444 | 551 |

(Evaluation of Electric Resistance Value R and Electric Resistivity ρ of P-type Thermoelectric Conversion Element)

With respect to the P-type thermoelectric conversion elements according to Examples 5 and 6 and Comparative Example 2, the electric resistance value R was measured by the four-terminal method. Results thereof are shown in Table 7.

TABLE 7

| | Average value of element electric resistance value R (mΩ) | Average value of element electric resistivity ρ (μΩ · m) | Metal layer |
|---|---|---|---|
| Example 5 | 27.4 | 99.0 | Cu |
| Example 6 | 10.0 | 36.1 | Cu |
| Comparative Example 2 | 57.0 | 205.9 | Cu |

Table 7 shows, with respect to the P-type thermoelectric conversion elements according to Examples 5 and 6 and Comparative Example 2, the electric resistance value R measured by the four-terminal method and the electric resistivity ρ calculated from Equation 4 above.

In Example 5, as shown in Table 7, the electric resistance value R of the elements was 27.4 mΩ and the electric resistivity ρ of the elements was 99.0 μΩ·m.

In Example 6, as shown in Table 7, the electric resistance value R of the elements was 10.0 mΩ and the electric resistivity ρ of the elements was 36.1 μΩ·m.

In Comparative Example 2, as shown in Table 7, the electric resistance value R of the elements was 57.0 mΩ and the electric resistivity ρ of the elements was 205.9 μΩ·m.

In Examples 5 and 6 shown in Table 7, P-type thermoelectric conversion elements having an electric resistance value R of 50 mΩ or less were obtained. In contrast, in Comparative Example 2, P-type thermoelectric conversion elements having an electric resistance value R higher than 50 mΩ were obtained.

INDUSTRIAL APPLICABILITY

The thermoelectric conversion element of the present disclosure can be used for various applications including applications of conventional thermoelectric conversion elements.

What is claimed is:

1. A thermoelectric conversion element comprising:
    a thermoelectric conversion layer;
    a first metal layer;
    a second metal layer;
    a first joining layer joining a first face of the thermoelectric conversion layer and the first metal layer; and
    a second joining layer joining a second face of the thermoelectric conversion layer and the second metal layer, wherein:
    the thermoelectric conversion layer comprises a thermoelectric conversion material, the thermoelectric conversion material containing Mg and at least one of Sb and Bi,
    the first metal layer and the second metal layer each comprise a simple substance of metal or a first alloy,
    at least one of the first joining layer and the second joining layer comprises a second alloy,
    a content of Mg in the second alloy is 84 atm % or more and 89 atm % or less,
    a content of Cu in the second alloy is 11 atm % or more and 15 atm % or less, and
    a content of an alkaline earth metal in the second alloy is 0.1 atm % or more and 1 atm % or less.

2. The thermoelectric conversion element according to claim 1, wherein:
    the content of Mg in the second alloy is 84.3 atm % or more and 88.5 atm % or less,
    the content of Cu in the second alloy is 10.5 atm % or more and 14.6 atm % or less, and
    the content of the alkaline earth metal content in the second alloy is 0.1 atm % or more and 1.1 atm % or less.

3. The thermoelectric conversion element according to claim 1, wherein
    the alkaline earth metal is Ca.

4. The thermoelectric conversion element according to claim 1, wherein
    the thermoelectric conversion material is a $Mg_3(Sb,Bi)_2$-based thermoelectric conversion material.

5. The thermoelectric conversion element according to claim 1, wherein
    the thermoelectric conversion material has a $La_2O_3$-type crystal structure.

6. The thermoelectric conversion element according to claim 1, wherein
    the thermoelectric conversion material is of an N-type.

7. The thermoelectric conversion element according to claim 1, wherein
    at least one of the first metal layer and the second metal layer comprises Cu or a Cu alloy.

8. A thermoelectric conversion module comprising:
an N-type thermoelectric conversion element; and
a P-type thermoelectric conversion element, wherein
at least one of the N-type thermoelectric conversion element and the P-type thermoelectric conversion element is the thermoelectric conversion element according to claim 1, and
the N-type thermoelectric conversion element and the P-type thermoelectric conversion element are electrically connected in series.

9. A joining material comprising:
Mg; and
Cu, wherein
a content of Mg in the joining material is 84 atm % or more and 89 atm % or less,
a content of Cu in the joining material is 11 atm % or more and 15 atm % or less,
a content of an alkaline earth metal in the joining material is 0.1 atm % or more and 1 atm % or less, and
the joining material is used for joining a thermoelectric conversion material and a metal member.

10. A method of manufacturing a thermoelectric conversion element, the method comprising:
filling, into a mold, a material of a first metal layer, a material of a first joining layer, a material of a thermoelectric conversion layer, a material of a second joining layer, and a material of a second metal layer in this order;
joining the material of the first metal layer, the material of the first joining layer, the material of the thermoelectric conversion layer, the material of the second joining layer, and the material of the second metal layer, which are filled into the mold, by heating at a predetermined temperature and pressurization to obtain a laminate; and
taking out the laminate from the mold, wherein
the material of the thermoelectric conversion layer contains Mg and at least one of Sb and Bi,
the material of the first metal layer and the material of the second metal layer each comprise a simple substance of metal or a first alloy,
at least one of the material of the first joining layer and the material of the second joining layer comprises a second alloy, and
a content of Mg in the second alloy is 84 atm % or more and 89 atm % or less,
a content of a Cu in the second alloy is 11 atm % or more and 15 atm % or less, and
a content of an alkaline earth metal in the second alloy is 0.1 atm % or more and 1 atm % or less.

11. The method according to claim 10, wherein
the predetermined temperature is 450° C. or more and 500° C. or less.

12. The method according to claim 10, further comprising
performing an annealing treatment on the laminate after taking out the laminate from the mold.

13. The thermoelectric conversion element according to claim 1, wherein
the alkaline earth metal includes at least one selected from the group consisting of Ca, Sr, Ba, and Ra.

14. The joining material according to claim 9, wherein
the alkaline earth metal includes at least one selected from the group consisting of Ca, Sr, Ba, and Ra.

* * * * *